United States Patent
Kim et al.

(10) Patent No.: US 10,324,118 B2
(45) Date of Patent: Jun. 18, 2019

(54) APPARATUS AND METHOD FOR CORRECTING POWER USAGE MEASUREMENTS

(71) Applicant: Encored Technologies, Inc., Seoul (KR)

(72) Inventors: Daeyoung Kim, Seoul (KR); Seonjeong Lee, Seoul (KR); Hyoseop Lee, Seoul (KR); Jong-woong Choe, Seoul (KR)

( * ) Notice: Subject to any disclaimer, the term of this patent is extended or adjusted under 35 U.S.C. 154(b) by 203 days.

(21) Appl. No.: 15/168,119

(22) Filed: May 30, 2016

(65) Prior Publication Data
US 2016/0370447 A1    Dec. 22, 2016

(30) Foreign Application Priority Data
Jun. 19, 2015   (KR) .................. 10-2015-0087096

(51) Int. Cl.
*G01R 22/10*   (2006.01)
*G06Q 50/06*   (2012.01)
*G01R 21/133*   (2006.01)
*G01R 22/06*   (2006.01)
*G01R 35/04*   (2006.01)

(52) U.S. Cl.
CPC ............ *G01R 22/10* (2013.01); *G01R 21/133* (2013.01); *G01R 22/063* (2013.01); *G01R 35/04* (2013.01); *G06Q 50/06* (2013.01)

(58) Field of Classification Search
None
See application file for complete search history.

(56) References Cited

U.S. PATENT DOCUMENTS

| | | | | |
|---|---|---|---|---|
| 6,133,720 A * | 10/2000 | Elmore | ................. | G01R 35/04 324/142 |
| 6,815,942 B2 * | 11/2004 | Randall | ................. | G01R 35/04 324/142 |
| 8,260,695 B1 * | 9/2012 | Rosenberg | ........... | G01R 21/133 323/220 |
| 8,620,885 B1 * | 12/2013 | Gupta | ................... | G06Q 50/06 707/697 |
| 2004/0066309 A1 * | 4/2004 | Jang | ....................... | H04Q 9/00 340/870.02 |
| 2014/0032506 A1 * | 1/2014 | Hoey | ................ | G06F 17/30303 707/691 |
| 2014/0279712 A1 * | 9/2014 | Ortner | ................ | G06Q 30/0283 705/412 |

* cited by examiner

*Primary Examiner* — John C Kuan
(74) *Attorney, Agent, or Firm* — John H. Choi & Associates LLC

(57) ABSTRACT

Embodiments herein provide a method for correcting power usage measurements at an apparatus. The method includes receiving, by the apparatus, a first power usage measurement from a utility meter measured at a first time unit and a second power usage measurement from a submeter measured at a set of second time units, wherein the set of second time units is dynamically defined with respect to the first time unit. Further, the method includes determining, by the apparatus, a time difference error based on the first time unit and each of the second time unit. Further, the method includes correcting, by the apparatus, the second power usage measurement based on the time difference error.

12 Claims, 8 Drawing Sheets

TIMER CLOCK  10 MINUTES AND 21 SECONDS/15 MINUTES

WATTAGE 12.5Kwh/20Kwh

APPARATUS AND METHOD FOR CORRECTING POWER USAGE MEASUREMENTS

CROSS-REFERENCE TO RELATED APPLICATIONS

This application claims priority to and the benefit of Korean Patent Application No. 10-2015-0087096 filed in the Korean Intellectual Property Office on Jun. 19, 2015, the entire contents of which are incorporated herein by reference.

This work was supported by the Development and Demonstration of IoT based Campus Microgrid of the Korea Institute of Energy Technology Evaluation and Planning (KETEP) granted financial resource from the Ministry of Trade, Industry & Energy, Republic of Korea (No. 20151210200080).

TECHNICAL FIELD

The present invention relates to energy management in power devices. More particularly, related to an apparatus and method thereof for correcting power usage measurements.

BACKGROUND

Generally, monitoring power usage at one or more locations (for example, residential, building, commercial and industrial sites) for billing purpose may involve calculating a power rate by measuring the power usage (i.e., power consumption) at the one or more locations. A utility meter (i.e., electricity meter, power meter, or the like) is a well-known device employed (and managed by utility agencies) for measuring the power usage. In addition to the utility meter, the deployment of a submeter at the one or more locations is increasing rapidly in order to monitor the power consumption of individuals (such as tenants, property owners, or the like) located therein. The submeter can facilitate the individuals to measure the power consumed by the individual equipment(s) and monitor the power usage accordingly thereto communicating the information to agencies managing the submeter. Each individual can, therefore, use the power usage measurements communicated from the submeter for effectively monitoring the bill as per the usage levels.

According to the constructional feature, measurement points of each utility meter and the submeter may be interfaced (passed) through a transformer. The power usage measured at the utility meter may include all measurement values measured at a high-voltage (HV) terminal after transformation (i.e., from the transformer) and the power usage measured at the submeter may include all measurement values measured at a low-voltage (LV) terminal after transformation. As the efficiency (i.e., ratio of the output (LV) to input (HV)) of the transformer is not ideal, a difference may occur between both the measurement points passing through the transformer. As a result, an error occurs due to difference in the measurement value of the power usage.

Furthermore, a minimum unit time between measurement and marking of power usage of the utility meter is 15 minutes. A minimum unit time between measurement and aggregation of power usage of the submeter may be 1 second or less. Also, there may be a time discrepancy (102), as shown in FIG. 1, between a measurement time and a marking time of the utility meter (for example, a power usage (104) marked between time instances 10:00 and 10:15 may actually be the power usage of the utility meter measured between time instances 9:57 and 10:12), as shown in the FIG. 1. Therefore, comparing the power usage measurement between the time instances 10:00 and 10:15, (which is measured by the submeter) and the power usage measurement between the time instances 10:00 and 10:15 (which is measured by the utility meter) is as equivalent to that of comparing power usages of different periods.

Thus, there exists a mismatch in the power usage measurement of the utility meter and the power usage measurement of the submeter (marked and measured at the same time instances 10:00 and 10:15 to that of the utility meter).

Thus, it is desired to address the above mentioned error caused due to the mismatch of the power usage measurements between the utility meter and the submeter or other shortcomings or at least provide a useful alternative.

SUMMARY

The principal object of the embodiments herein is to provide an apparatus and method thereof for correcting power usage measurements.

Another object of the embodiments herein is to provide an apparatus and method for receiving a first power usage measurement from a utility meter measured at a first time unit and a second power usage measurement from a submeter measured at a set of second time units, wherein the set of second time units is dynamically defined with respect to the first time unit.

Another object the embodiments herein are to provide an apparatus and method for determining a time difference error based on the first time unit and each of the second time unit.

Another object of the embodiments herein is to provide an apparatus and method for correcting the second power usage measurement based on the time difference error.

Accordingly the embodiments herein provide a method for correcting power usage measurements at an apparatus. The method includes receiving, by the apparatus, a first power usage measurement from a utility meter measured at a first time unit and a second power usage measurement from a submeter measured at a set of second time units, wherein the set of second time units is dynamically defined with respect to the first time unit.

Further, the method includes determining, by the apparatus, a time difference error based on the first time unit and each of the second time unit. Furthermore, the method includes correcting, by the apparatus, the second power usage measurement based on the time difference error.

In an embodiment, the set of second time units can include at least one of a time unit preceding the first time unit and a time unit exceeding the first time unit.

In an embodiment, each of the second time unit in the set of second time units is defined in a sequence up until the first time unit.

In an embodiment, the second power usage measurements are measured in accordance with the sequence of each of the second time units.

In an embodiment, the second power usage measurements are measured at the time unit preceding the first time unit and at the time unit exceeding the first time unit.

In an embodiment, determining the time difference error based on the first time unit and the each of the second time unit includes determining time differences between the first time unit and the each of the second time unit; determining a time unit when one of the time differences between the first time unit and the each of the second time unit becomes minimum and determining the time difference error based on a difference between the first time unit and the time unit when one of the time differences between the first time unit and the each of the second time unit becomes minimum.

In an embodiment, correcting the second power usage measurement based on the time difference error includes generating a correction function to correct the second power usage measurements based on a power difference error log and correcting the second power usage measurement based on the correction function.

In an embodiment, the method further includes transmitting the corrected second power usage measurement to an end user device.

Accordingly the embodiments herein provide an apparatus for correcting power usage measurements. The apparatus includes a communication unit, a controller unit, a correction unit, and a storage unit. The communication unit configured to receive a first power usage measurement from a utility meter at a first time unit and second power usage measurements from a submeter at a set of second time units, wherein the set of second time units is dynamically defined with respect to the first time unit. The controller unit is configured to determine a time difference error based on the first time unit and each of the second time unit. The correction unit is configured to correct the second power usage measurement based on the time difference error.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This invention is illustrated in the accompanying drawings, throughout which like reference letters indicate corresponding parts in the various figures. The embodiments herein will be better understood from the following description with reference to the drawings, in which.

DETAILED DESCRIPTION OF INVENTION

Figure 1:
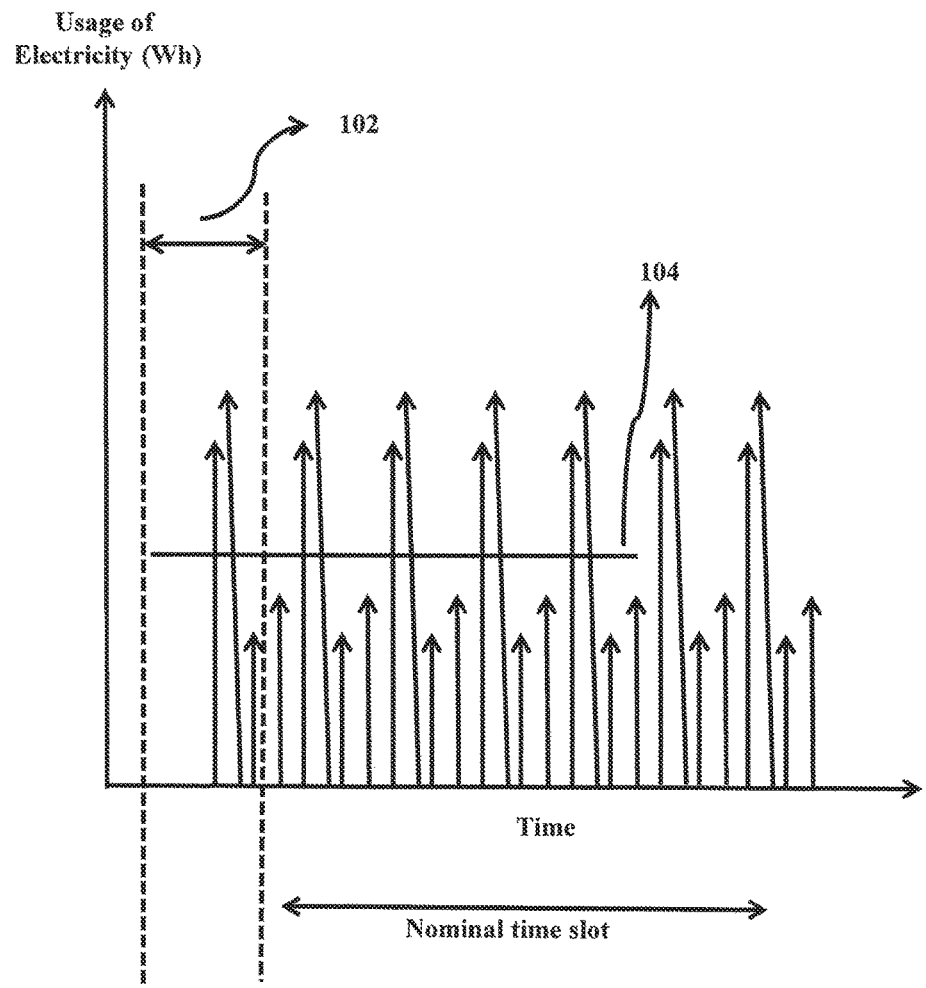
FIG. 1 is a graph illustrating variation of power usage measurements (generated by a utility meter and a submeter) with a time unit according to a prior art.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

The embodiments herein disclose a method for correcting power usage measurements at an apparatus. The method includes receiving, by the apparatus, a first power usage measurement from a utility meter measured at a first time unit and a second power usage measurement from a submeter measured at a set of second time units, wherein the set of second time units is dynamically defined with respect to the first time unit. Further, the method includes determining, by the apparatus, a time difference error based on the first time unit and each of the second time unit. Furthermore, the method includes correcting, by the apparatus, the second power usage measurement based on the time difference error.

Unlike conventional systems and methods, the proposed method can be used to effectively monitor the power usage thereto providing the accurate bill by eradicating the error caused due to mismatch logged between the measurement points of the utility meter and the submeter.

Unlike conventional systems and methods, the proposed method can be used to provide a correction function to the error logged due to a non-ideal transformer efficiency therewith enabling to accurately estimate a measurement amount of the utility meter to be actually charged.

Unlike conventional systems and methods, the proposed mechanism can be used to provide an end user or utility providers to effectively inquire the bill generated (in real time) to the amount of power consumed by each of the equipment of the end user.

The proposed mechanism can be used to guide service based on a real-time usage of the power which was impossible by the existing utility meter having minimum unit time of 15 minutes.

The embodiments disclosed herein can be implemented through at least one software program running on at least one hardware device and performing network management functions to control the elements. The elements shown in the FIGS. 2 through 7 include blocks which can be at least one of a hardware device, or a combination of hardware device and software units.

Figure 2:
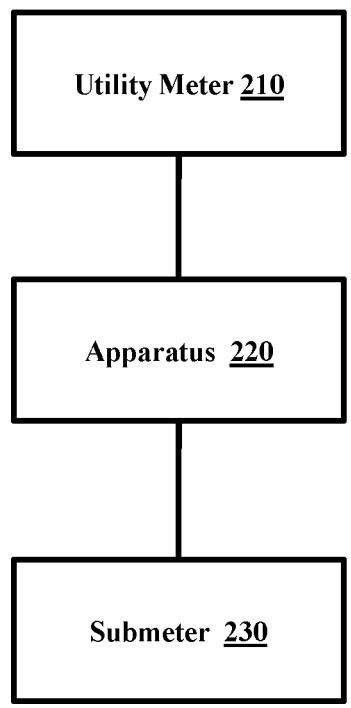
FIG. 2 illustrates an a high level overview of a system for correcting power usage measurements, according to an embodiment as disclosed herein.

FIG. 2 illustrates a high level overview of a system 200 for correcting power usage measurements, according to an embodiment as disclosed herein. The system 200 includes a utility meter 210, an apparatus 220 and a smartmeter 230. The utility meter 210 can be configured to measure the first power usage through one or more measuring points associated with the utility meter 210. The one or more measuring points can be used to measure the power usage at a main load (High-Voltage (HV)) side of a transformer unit 221 (not shown). The first power usage measurement is performed at the unit time (for example, 15 minutes), as shown in FIG. 3. Thus, the first power usage measurement (i.e., a measurement value of the utility meter 210 measured at the HV terminal of the transformer unit 221) is used for calculating the bill (usage bill).

The utility meter 210 can be configured to communicate (i.e., through a wireless network, a Zigbee, a bluetooth, or the like) with the apparatus 220 which in turn communicates with the submeter 230. The utility meter 210 can be a main meter (i.e., master meter) managed by the utility agencies which are responsible for monitoring the utility necessities, such as electricity, water, gas, or the like. The utility agencies can, therefore, generate the usage bill to the end user device (end user(s), for example, property owners, landlords, tenants, or the like). In an embodiment, the utility meter 210 can be an analog or digital utility meter. The power usage measurement start time for corresponding 15 minutes may vary depending on the utility meter.

In an embodiment, the apparatus 220 can be located remotely (i.e., server) to that of the utility meter 210 and the submeter 230. In an embodiment, the apparatus 220 can be located around (or, may be intelligently located within) the transformer unit 221. The apparatus 220 may be configured to collect the power usage measurements from the submeter 230 and the utility meter 210. In an embodiment, the apparatus 220 can include, but not limited to, data processing device, electronic device, a Personal Computer (PC), a laptop computer, a mobile device, a smart phone, a Personal Digital Assistance (PDA), Internet of Things (IoT) device, electronic circuit and electrical circuit configured to perform the proposed method, or the like. Further, a time difference error (caused due to one of the reasons described herein) can be logged and analyze the power usage measurements in order to provide the correction function to mitigate the logged power difference error (as detailed in FIG. 4).

The submeter 230 can be, for example, a private meter(s) managed by the end user(s) in order to determine the individual power usage levels and bill the end user accordingly. In an embodiment, the submeter 230 can be configured to measure second power usage through one or more measuring points associated with the submeter 230. The one or more measuring points can be used to measure the power usage at Low-Voltage (LV) side of a transformer unit 221 (not shown). The submeter 230 may be installed for collecting apparatus 220 operation information in the building (end user location).

FIG. 2 shows a limited overview of the system 200 but, it is to be understood that other embodiments are not limited thereto. Further, the system can include any number of any numbers of hardware or software components communicating with each other. By way of illustration, both an application running on a device and the device itself can be a component.

Figure 3A:
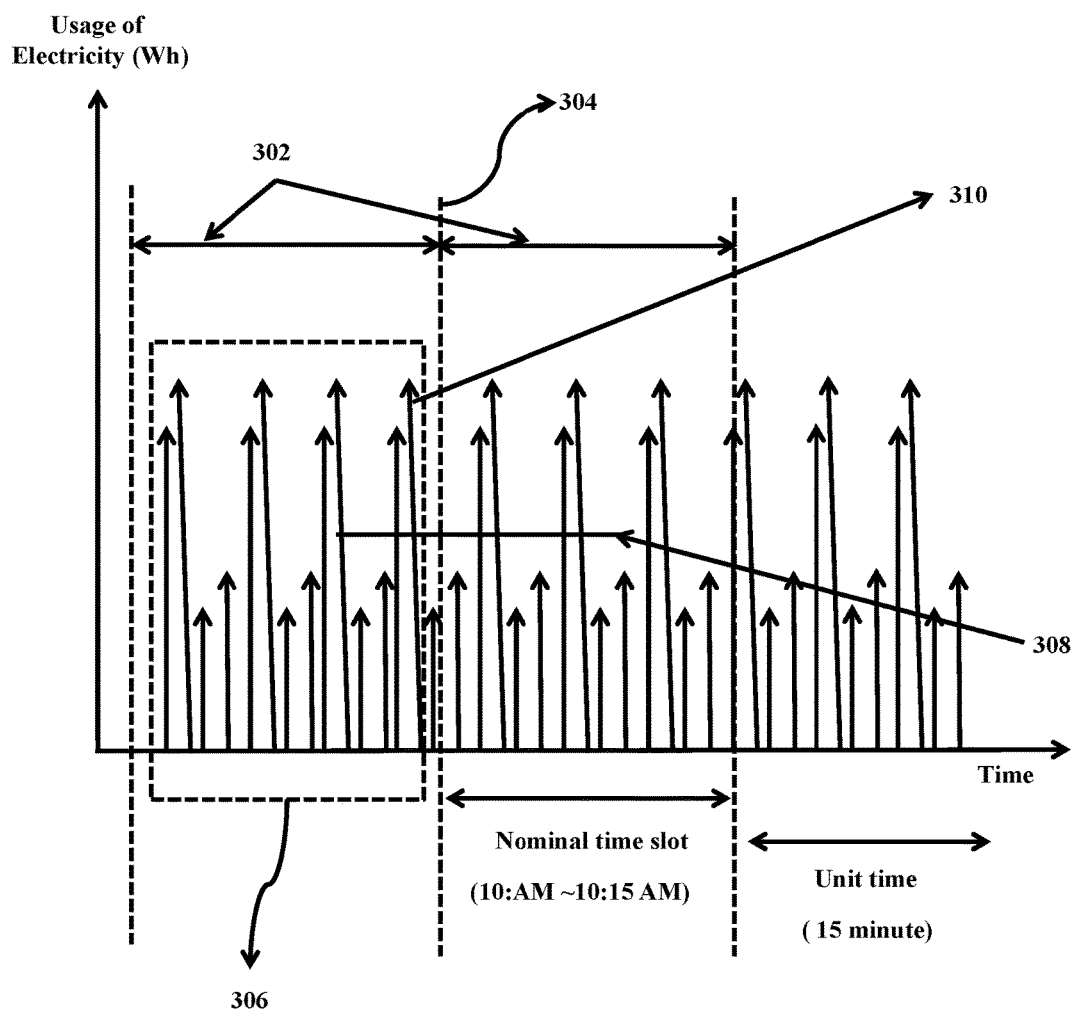
FIG. 3A is a graph illustrating variation of power usage measurements (generated by a utility meter and a submeter) with a time unit, according to embodiments as disclosed herein.
Figure 3B:
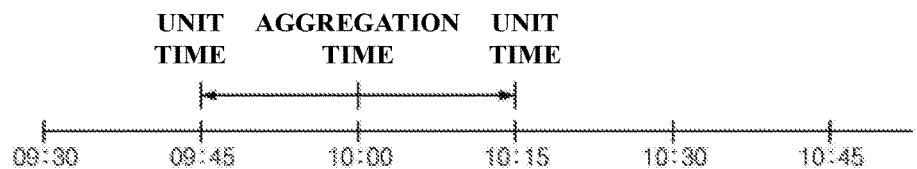
FIG. 3B is an example illustration of a time difference estimation range of the power usage measurements, according to embodiment as disclosed herein.

FIG. 3A is the graph illustrating variation of the power usage measurements (measured by the utility meter 210 and the submeter 230) with the time unit, according to the embodiment as disclosed herein. In an embodiment, the proposed method can be used to determine the time discrepancy (time discrepancy (102) as shown in FIG. 1). The method includes setting up a time window, wherein the measurements of the submeter 230 can be aggregated inside the time widow.

Further, the method includes comparing (306) the power usage measurement (308) of the utility meter 210 and the power usage measurement (310) of the submeter 230. Furthermore, the method includes shifting the time window by 1 second until a start of the time window meets the marking time (304) and the unit time (302). Thus, the actual time discrepancy is determined based on time point when the comparison result is minimum. In detail, in the embodiment, since the measurement unit time of the utility meter 210 is assumed as 15 minutes, a difference between an actual measurement time of the utility meter 210 and the marking time may occur up to a maximum of 15 minutes (900 seconds) with reference to FIG. 3B.

In an embodiment, the marking time can be a start time of a time range corresponding to a unit time usage. For example, when the unit time is 15 minutes, the marking time of the first power usage between 10:00 and 10:15 may be 10 o'clock.

Figure 4:
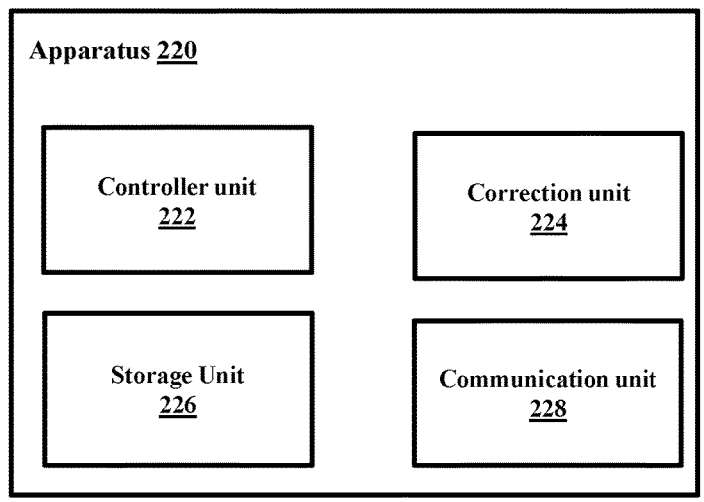
FIG. 4 illustrates various units of an apparatus for correcting power usage measurements, according to embodiments as disclosed herein.

FIG. 4 illustrates various units of the apparatus 220 for correcting the power usage measurements, according to an embodiment as disclosed herein. In an embodiment, the apparatus 220 can include a controller unit 222, a correction unit 224, a storage unit 226 communicatively coupled to the controller unit 222 and a communication unit 228.

In an embodiment, the controller unit 222 communicatively coupled to the communication unit 228, wherein the communication unit 228 is configured to receive the first power usage measurement from the utility meter 210 measured at the first time unit and the second power usage measurement from the submeter 230 measured at the set of second time units, wherein the set of second time units is dynamically defined with respect to the first time unit.

The controller unit 222 can be configured to determine the time difference error based on the first time unit and each of the second time unit. Further, the controller unit 222 communicatively coupled to the correction unit 224, wherein the correction unit 224 can be configured to correct the second power usage measurement based on the time difference error. The correcting may include reflecting the time difference error in the second power usage measurement. That is, when the correction unit 224 corrects the second power usage measurement, it means that the correction unit 224 reflects the time difference error into the second power usage measurement.

In an embodiment, the controller unit 222 can be configured to determine the time difference error based on the first time unit and the set of the second time units comprises determining the time differences between the first time unit and the set of second time units. Further, the controller unit 222 can be configured to determine the time unit when one of the time differences between the first time unit and the set of the second time units becomes minimum, expressed as:

for time_delay from −900 to 900

Estimation of a function between the power usage of the utility meter 210 and the power usage of the submeter 230 (time_delay applied)

End for      Equation (1)

Unlike conventional systems and methods, where unit bills depending on time are different from each other. The proposed mechanism can be therefore be used to evaluate the bill based on the power usage acquired by applying the correction function to the submeter 230.

Further, the communication unit 228 can be configured to transmit corrected second power usage measurement to the end user device 410 (not shown). In an embodiment, the end user device 410 can include, but not limited to, a Personal Computer (PC), a laptop computer, a mobile device, a smart phone, a Personal Digital Assistance (PDA), Internet of Things (IoT) device or the like.

Figure 6:
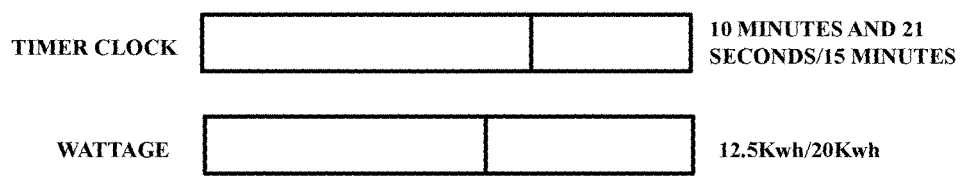
FIG. 6 is an example illustration of real-time information of a timer clock and a real-time power usage, according to embodiments as disclosed herein.

In an embodiment, the time discrepancy of the utility meter 210 and a time delay are calculated using the equation (1), and a pre-determined time such as, 180 (seconds), 57 minutes, 12 minutes, 27 minutes, and 42 minutes every hour is set as the start time of the calculation, as shown in FIG. 6. If an index, defined in equation (2), which is a usage ratio of a predicted power usage to a reference usage, set by the end user device 410 (or intelligently recorded by the apparatus 220 based on the end user power usage pattern, stored by the storage unit 226) exceeds a time ratio of the current time to the pre-determined time, a notification to the end user is provided. The notification can include indicating a warning to the end user device 410 that the usage ratio is exceeding (or, exceeded) the time ratio, and the index and the predicted usage can be expressed as:

Index=[predicted usage]/[reference usage]

(Predicted usage=[current usage+usage increased for recent 5 seconds/5 seconds*remaining time])  Equation (2)

The storage unit 226 can be configured to store power difference error determined by the controller unit 222, an example of the power difference error logged by the storage unit 226 is shown in Table 1. The power difference error may be calculated and stored in the storage unit 226 after the time discrepancy is corrected in order to remove the effect of the transformer which may be intervened between the utility meter and the submeter. The storage unit 226 may store the power difference error log for long period enough to calculate a error correction function which is to be explained below. For example, the long period can be more than 3 months.

TABLE 1

| Time | Utility meter 210 Usage (Wh) | Submeter 230 Usage (Wh) | Power difference Error |
|---|---|---|---|
| March 27th 10-00~10:15 | 10 | 11 | −1 |
| March 27th 10-15~10:30 | 11 | 15 | −1 |
| March 27th 10-30~10:45 | 12 | 8 | 4 |
| March 27th 10-45~11:00 | 8 | 5 | 3 |
| March 27th 11-00~11:15 | 8 | 6 | −1 |

The communication unit 228 is further configured for communicating internally between internal units and with external devices via one or more networks. The storage unit 226 may include one or more computer-readable storage media. The storage unit 226 may include non-volatile storage elements, Examples of such non-volatile storage elements may include magnetic hard disc, optical discs, floppy discs flash memories, or forms of electrically programmable memories (EPROM) or electrically erasable and programmable (EEPROM) memories. In addition, the storage unit 226 may, in some examples, be considered a non-transitory storage medium. The term "non-transitory" may indicate that the storage medium is not embodied in a carrier wave or a propagated signal. However, the term "non-transitory" should not be interpreted that the storage unit 226 is non-movable. In some examples, the storage unit 226 can be configured to store larger amounts of information than a memory. In certain examples, a non-transitory storage medium may store data that can, over time, change (e.g., in Random Access Memory (RAM) or cache).

Although FIG. 4 shows exemplary units of the apparatus 220 but it is to be understood that other embodiments are not limited thereon. In other embodiments, the apparatus 220 may include less or more number of units. Further, the labels or names of the units are used only for illustrative purpose and does not limit the scope of the invention. One or more units can be combined together to perform same or substantially similar function for correcting the correcting power usage measurements.

Figure 5A:
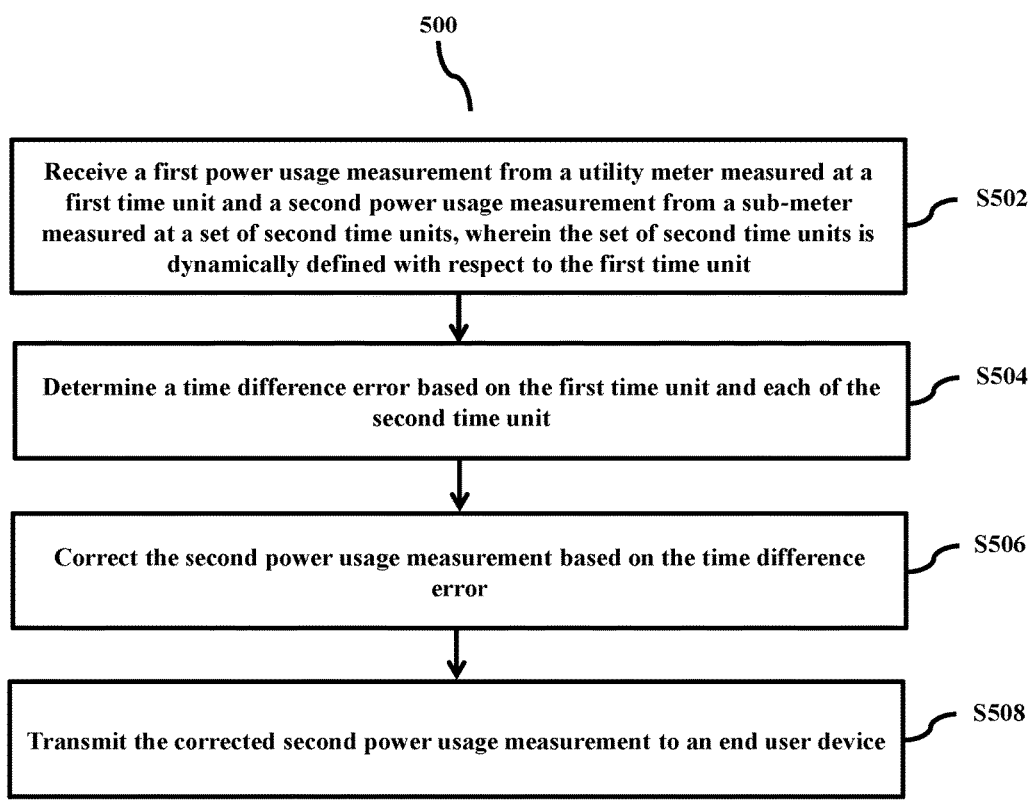
FIGS. 5A-5C are a flow diagrams illustrating methods for correcting power usage measurements, according to embodiments as disclosed herein.

FIG. 5A is a flow diagram 500 illustrating the method for correcting the power usage measurements, according to an embodiment as disclosed herein. At step S502, the method includes receiving the first power usage measurement from the utility meter 210 measured at the first time unit and the second power usage measurement from the submeter 230 measured at the set of second time units, wherein the set of second time units is dynamically defined with respect to the first time unit. In an embodiment, the method allows the communication unit 228 to receive the first power usage measurement from the utility meter 210 measured at the first time unit and the second power usage measurement from the submeter 230 measured at the set of second time units, wherein the set of second time units is dynamically defined with respect to the first time unit.

At step S504, the method includes determining the time difference error based on the first time unit and each of the second time unit. In an embodiment, the method allows the controller unit 222 to determine the time difference error based on the first time unit and each of the second time unit.

At step S506, the method includes correcting the second power usage measurement based on the time difference error. In an embodiment, the method allows the correction unit 224 to correct the second power usage measurement based on the time difference error.

At step S508, the method includes transmitting the corrected second power usage measurement to the end user device 410. In an embodiment, the method allows the communication unit 228 to transmit corrected second power usage measurement to an end user device.

The various actions, acts, blocks, steps, or the like in the method of the flow diagram 500 may be performed in the order presented, in a different order or simultaneously. Further, in some embodiments, some of the actions, acts, blocks, steps, or the like may be omitted, added, modified, skipped, or the like without departing from the scope of the invention.

Figure 5B:
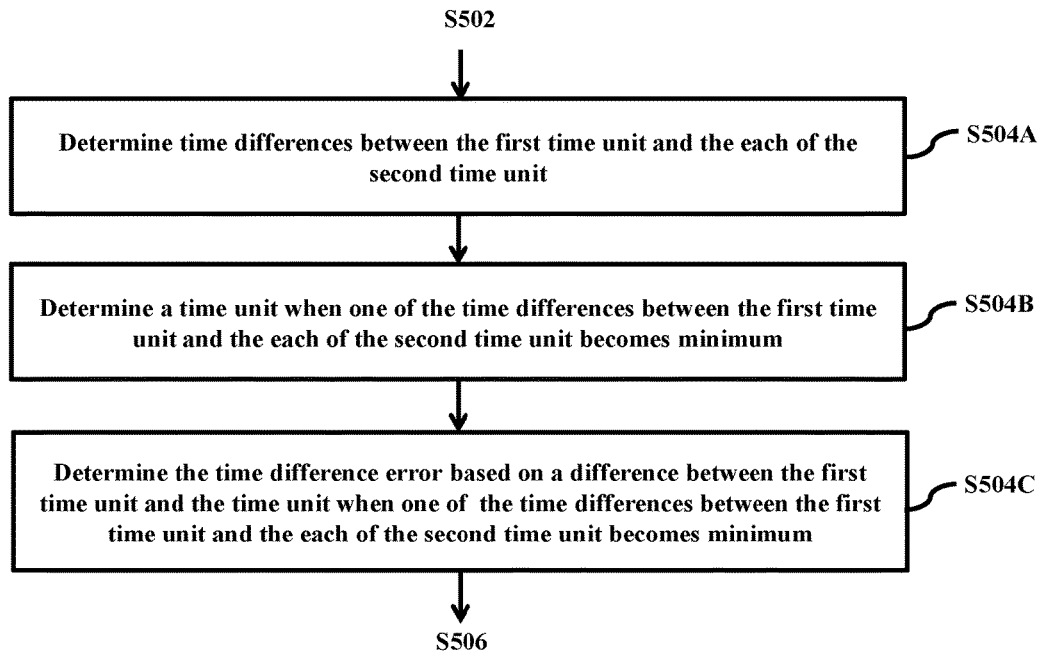

FIG. 5B is a flow diagram illustrating the method for correcting the power usage measurements, according to the embodiment as disclosed herein. The step S502 of FIG. 5A is considered as an input to the step S504A, wherein the method, at the step S504A, includes determining time differences between the first time unit and each of the second time unit. In an embodiment, the method allows the controller unit 222 to determine time differences between the first time unit and each of the second time unit.

At step S504B, the method includes determining the time unit when one of the time differences between the first time unit and the each of the second time unit becomes minimum. In an embodiment, the method allows the controller unit 222 to determine the time unit when one of the time differences between the first time unit and the each of the second time unit becomes minimum.

At step S504C, the method includes determining the time difference error based on the difference between the first time unit and the time unit when one of the time differences between the first time unit and the each of the second time unit becomes minimum. In an embodiment, the method allows the controller unit 222 to determine the time difference error based on the difference between the first time unit and the time unit when one of the time differences between the first time unit and the each of the second time unit becomes minimum.

Further, the output of the step S504C is provided as an input to the step S506.

Figure 5C:
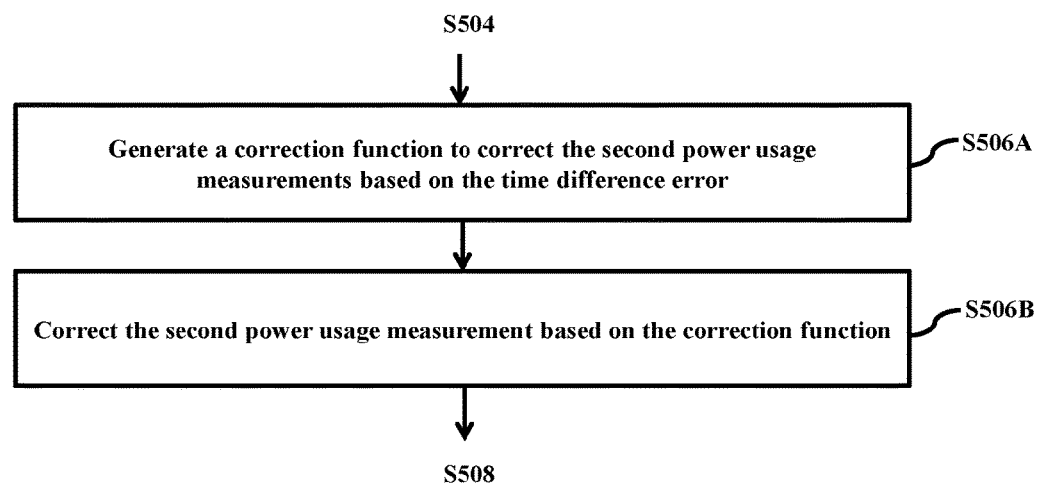

FIG. 5C is a flow diagram illustrating the method for correcting the power usage measurements, according to an embodiment as disclosed herein. The output of the step S504 is considered as an input to the step S506A. The method at step S506A may include generating the correction function to correct the second power usage measurements based on the power difference error log stored in the storage unit 226. The correction function can be calculated by regression analysis. In an embodiment, the method allows the correction unit 224 to generate the correction function to correct the second power usage measurements based on the error log.

At step S506B, the method includes correcting the second power usage measurement based on the correction function. This measurement is the input for step S508 shown in FIG. 5A. In an embodiment, the method allows the correction unit 224 to correct the second power usage measurement based on the correction function.

FIG. 6 is an example illustration of real-time information of a timer clock and a real-time power usage, according to the embodiment as disclosed herein.

According to the present invention, since the bill is calculated and provided based on the power usage in which the correction function is applied to the submeter 230 measurement value, a used bill suitable for an actual usage may be calculated. Further, a guide regarding a power usage based on the current usage may be provided to the end user device 410 by considering the measurement time difference of the utility meter 210.

Unlike conventional systems and methods, where the power usage is updated at an interval of 15 minutes by the utility meter, accessing the information on the current power usage may involve a delay, as the updating of the information takes may involve a delay. Thus, according to the proposed method the correction function computed by the correction unit 224 and communicated, through the communication unit 228, to the end user device 410 is used to determine the power usage. Further, the 15 second-unit usage may be used to monitor the bill setting or penalty imposing.

Figure 7:
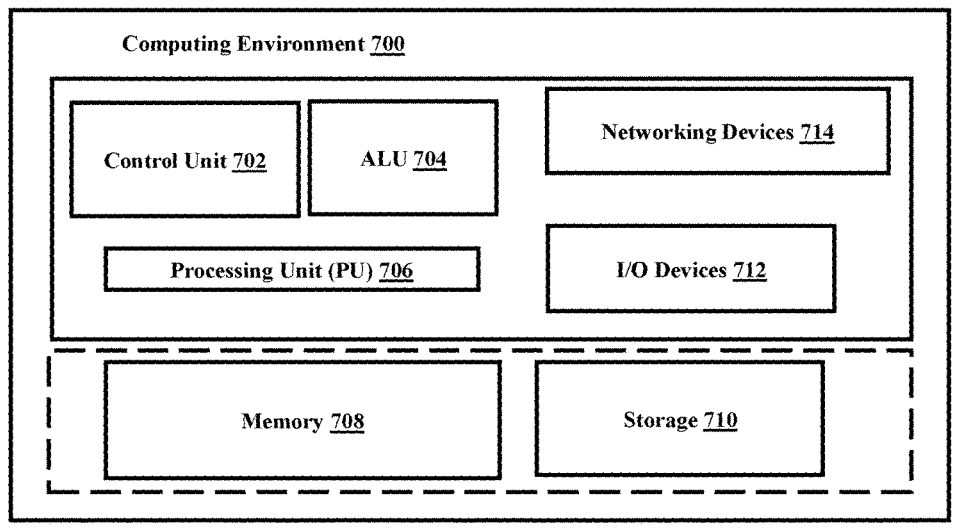
FIG. 7 illustrates a computing environment implementing the apparatus and method thereof for correcting power usage measurements, according to embodiments as disclosed herein.

FIG. 7 illustrates a computing environment 700 implementing the apparatus and method thereof for correcting power usage measurements, according to an embodiment as disclosed herein. As depicted in the FIG. 7, the computing environment 700 comprises at least one processing unit 706 that is equipped with a control unit 702, an Arithmetic Logic Unit (ALU) 704, a memory 708, a storage unit 710, a plurality of networking devices 714, and a plurality Input Output (I/O) devices 712. The processing unit 706 is responsible for processing the instructions of the technique. The processing unit 706 receives commands from the control unit 702 in order to perform its processing. Further, any logical and arithmetic operations involved in the execution of the instructions are computed with the help of the ALU 704.

The overall computing environment 700 can be composed of multiple homogeneous or heterogeneous cores, multiple CPUs of different kinds, special media and other accelerators. The processing unit 706 is responsible for processing the instructions of the technique. Further, the plurality of processing units 706 may be located on a single chip or over multiple chips.

The technique comprising of instructions and codes required for the implementation are stored in either the memory unit 708 or the storage 710 or both. At the time of execution, the instructions may be fetched from the corresponding memory 708 or storage 710, and executed by the processing unit 706.

In case of any hardware implementations various networking devices 716 or external I/O devices 712 may be connected to the computing environment 700 to support the implementation through the networking unit and the I/O device unit.

Figure 8:
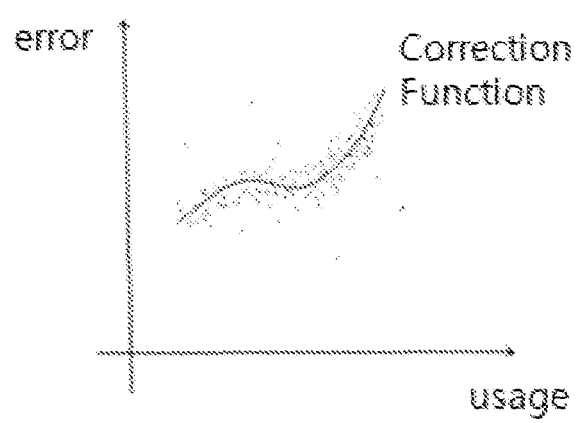
FIG. 8 is a graph illustrating correction function based on error and usage.

FIG. 8 illustrates the correction function of the present invention based on error and usage.

The embodiments disclosed herein can be implemented through at least one software program running on at least one hardware device and performing network management functions to control the elements. The elements shown in the FIGS. 2 to 7 include blocks, elements, actions, acts, steps, or the like which can be at least one of a hardware device, or a combination of hardware device and software module The foregoing description of the specific embodiments will so fully reveal the general nature of the embodiments herein that others can, by applying current knowledge, readily modify or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

What is claimed is:

1. A method for correcting power usage measurements at an apparatus, the method comprising:
receiving, by the apparatus, a first power usage measurement from a utility meter measured at a first time unit and second power usage measurements from a submeter measured at a set of second time units, wherein the set of second time units is dynamically defined with respect to the first time unit;
determining, by the apparatus, a time difference error based on the first time unit and the set of the second time units, wherein determining the time difference error comprises:
determining time differences between the first time unit and each of the second time units;
determining a time unit when one of the time differences between the first time unit and each of the second time units becomes minimum; and determining the time difference error based on a difference between the first time unit and the time unit when one of the time differences between the first time unit and each of the second time units becomes minimum;

correcting, by the apparatus, the second power usage measurements based on the time difference error; and transmitting the corrected second power usage measurements to an end user device.

2. The method of claim 1, wherein the set of second time units comprises at least one of a time unit preceding the first time unit and a time unit exceeding the first time unit.

3. The method of claim 2, wherein each of the second time units is defined in a sequence up until the first time unit.

4. The method of claim 3, wherein the second power usage measurements are measured in accordance with the sequence of each of the second time units.

5. The method of claim 2, wherein the second power usage measurements are measured at the time unit preceding the first time unit and at the time unit exceeding the first time unit.

6. The method of claim 1, wherein correcting the second power usage measurement comprises:

storing a power difference error in an error log;

generating a correction function to correct the second power usage measurements based on the error log; and correcting the second power usage measurements based on the correction function.

7. An apparatus for correcting power usage measurements, the apparatus comprising:

a communication unit configured to receive a first power usage measurement from a utility meter at a first time unit and second power usage measurements from a submeter at a set of second time units, wherein the set of second time units is dynamically defined with respect to the first time unit;

a controller unit configured to determine a time difference error based on the first time unit and each of the second time units, wherein determining the time difference error comprises:

determining time differences between the first time unit and each of the second time units;

determining a time unit when one of the time differences between the first time unit and each of the second time units becomes minimum; and determining the time difference error based on a difference between the first time unit and the time unit when one of the time differences between the first time unit and each of the second time units becomes minimum; and a correction unit configured to correct the second power usage measurements based on the time difference error;

wherein the communication unit is further configured to transmit the corrected second power usage measurements to an end user device.

8. The apparatus of claim 7, wherein the set of second time units comprises at least one of a time unit preceding the first time unit and a time unit exceeding the first time unit.

9. The apparatus of claim 8, wherein each of the second time units in the set of second time units is defined in a sequence up until the first time unit.

10. The apparatus of claim 9, wherein the second power usage measurements are measured in accordance with the sequence of the second time units.

11. The apparatus of claim 8, wherein the second power usage measurements are measured at the time unit preceding the first time unit and at the time unit exceeding the first time unit.

12. The apparatus of claim 7, wherein the correction unit configured to correct the second power usage measurements based on the time difference error comprises the steps of:

storing a power difference error in an error log;

generating a correction function to correct the second power usage measurements based on the error log; and correcting the second power usage measurements based on the correction function.

* * * * *